United States Patent
Sywyk

(12) 
(10) Patent No.: US 6,661,716 B1
(45) Date of Patent: Dec. 9, 2003

(54) WRITE METHOD AND CIRCUIT FOR CONTENT ADDRESSABLE MEMORY

(75) Inventor: Stefan P. Sywyk, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/081,643

(22) Filed: Feb. 21, 2002

(51) Int. Cl.[7] .................................................. G11C 7/00
(52) U.S. Cl. ...................................... 365/191; 365/194
(58) Field of Search ..................... 365/149, 49, 189.04, 365/190, 191, 194, 202, 233, 220, 230.06, 189.08

(56) References Cited

U.S. PATENT DOCUMENTS 5,319,589 A * 6/1994 Yamagata et al. ............ 365/49
5,452,243 A * 9/1995 Ansel et al. .................. 365/49

* cited by examiner

*Primary Examiner*—Thong Le
(74) *Attorney, Agent, or Firm*—Bradley T. Sako

(57) ABSTRACT

According to one embodiment, the write circuitry of a content addressable memory (CAM) can include periphery circuits (102) that generate data signals (112) and write control signals (118) that connect over some distance to CAM core circuits (104). CAM core circuits (104) may include bitline write driver circuits (106), a write control circuit (108), and CAM cells (110). Write control signals (118) may include a signal surrounded by its complements and be positioned such that a routing of the write control signal is as long as the longest of the data signals (112).

20 Claims, 5 Drawing Sheets

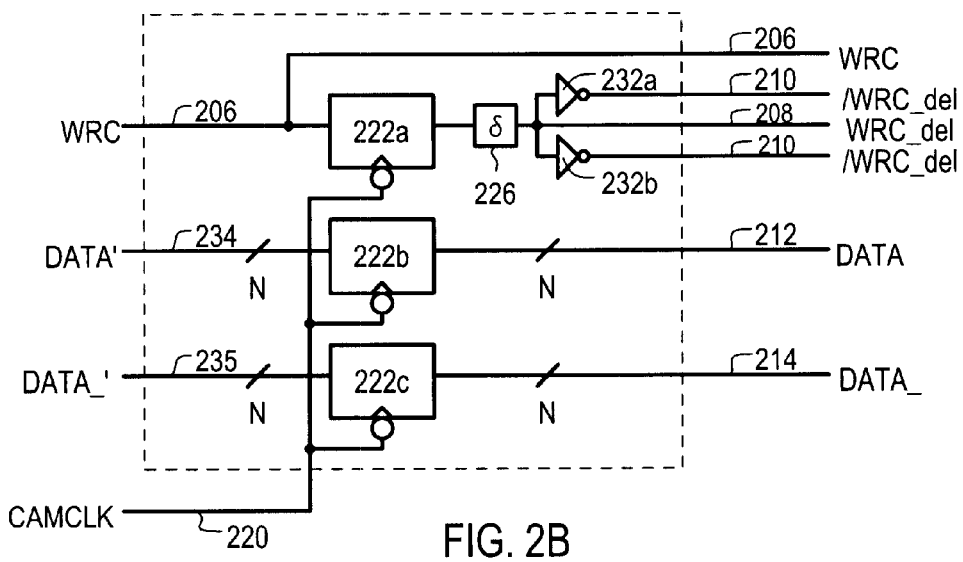
FIG. 2B
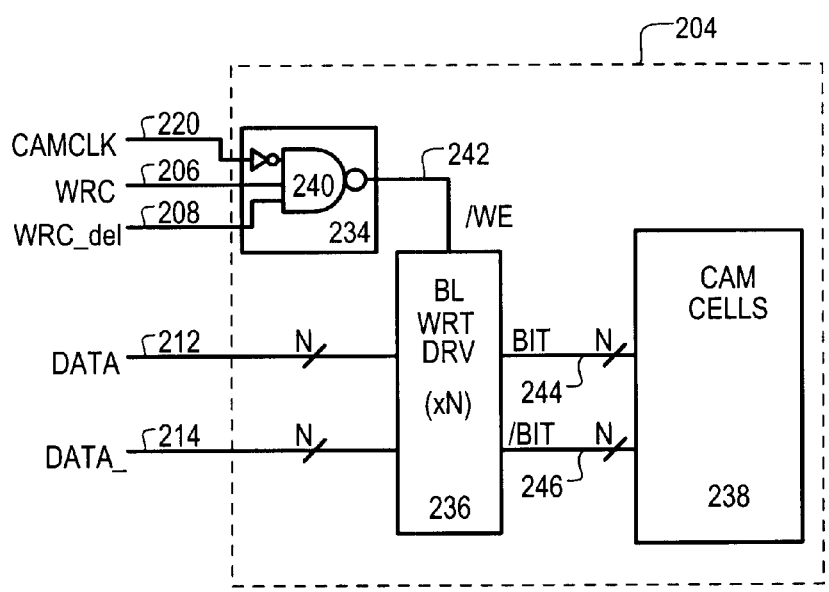
FIG. 2C
| DATA | DATA_ | OPERATION |
|------|-------|-----------|
| 0 | 0 | MASK |
| 0 | 1 | WRITE 0 |
| 1 | 0 | WRITE 1 |
| 1 | 1 | N/A |
FIG. 3A

WRITE METHOD AND CIRCUIT FOR CONTENT ADDRESSABLE MEMORY

TECHNICAL FIELD

The present invention relates generally to data transfer circuits for semiconductor memory devices, and more particularly to write circuits and methods for content addressable memories (CAMs).

BACKGROUND OF THE INVENTION

Due to the increased prevalence of information networks, including the Internet, content addressable memories (CAMs) continue to proliferate. CAMs, sometimes referred to as "associative memories" can provide rapid matching functions that are often needed in routers and network switches to process network packets. As just one example, a router can use a matching function to match the destination of an incoming packet with a "forwarding" table. The forwarding table can provide "next hop" information that can allow the incoming packet to be transmitted to its final destination, or to another node on the way to its final destination. Of course, CAMs can also be used for applications other than network hardware.

An overview of a typical conventional CAM architecture will now be described, with particular emphasis on how data is written into the memory.

A CAM may generally be partitioned into smaller arrays (or "sub-arrays"), each sharing a common data bus. Referring to FIG. 5, an example of a CAM that is partitioned into eight smaller sub-arrays is shown, and is designated by the general reference character 500. The CAM 500 is shown to include periphery circuits 502 that may generate signals that route to eight CAM sub-arrays, 504-0 to 504-7.

CAM sub-arrays (504-0 to 504-7) may each include a local write circuit 506 that writes data into CAM cells 510 by way of bitline signals 514.

A data bus 518 may include a relatively large number of data signal line (e.g., greater than about 70, more particularly greater than 100, even more particularly about 144). Data signals may be placed on data signal lines 518 by periphery circuits 502, thereby transferring data to each CAM sub-array 504-0 to 504-7. A write enable signal 512 may also be generated by periphery circuits 502 and connect to each CAM sub-array 504-0 to 504-7. A write enable signal 512 may be used to initiate a write operation.

A write operation in a typical conventional CAM 500 may be performed by asserting data signals 518 to desired data states, and then activating a write enable signal 512 to a predetermined state (e.g., high). Data on data signals 518 may then be written into CAM sub-arrays 504-0 to 504-7. It is understood that this is a simplified description of an actual conventional write implementation. In some cases, the write operation may also be controlled according to a clock signal, for example.

CAMs are used in many applications such as network routers and switches where reliable, high-speed operation is very desirable. Thus, it is important that the write operation described above be performed reliably and as quickly as possible. An important factor in achieving this goal is in the timing of a write enable signal 512 relative to data signals 518. If a write operation is initiated before data on data signal lines 518 is valid, incorrect data may be written into the CAM sub-arrays.

Many factors can affect the time it may take for data on data signals 518 to propagate to CAM sub-arrays 504-0 to 504-7. For example, there may be many CAM write circuits 506 spread across each CAM sub-array. Thus, in some cases data may propagate for a shorter distance, while in other cases data may propagate for a longer distance to reach a CAM sub-array (504-0 to 504-7). Also, there may be a large number of data signals routed together across the CAM array. The routing location for some data signals can therefore be physically located further away from the CAM write circuits 506 than others, which means there may be a longer propagation delay associated with such longer routed data signals.

Another factor that can affect signal speed is capacitive coupling between adjacent signal lines. It is well known that there can be a parasitic capacitance between signals routed on an integrated circuit. Thus, if a data signal is transitioning in one direction (e.g. from low to high) while data signals on either side are transitioning in the opposite direction (high to low in this case), then the capacitive coupling between the lines can cause the transition of the signal to slow down. It follows that a worst case coupling can occur if signals on both sides of the data signal in question are transitioning in the opposite direction to the data of the data signal itself.

The timing of the write enable signal 512 can therefore be affected by one or all of the factors described above.

Typically, a conventional circuit that generates a write enable signal 512 can have a means of delaying the signal to account for the above described factors. It may not be possible to precisely predict the effect of the above factors, however, since they may change as a result of wafer processing variations or due to different operating conditions of the device, as but two examples. In practice, extra margin or "guardband" may be added to such a timing delay of a write enable signal 512 to account for these uncertainties. By adding such guardband delay, write operations may be made more reliable.

A drawback to introducing delay (including guardband noted above) into a write enable signal can be additional time that may be needed for a write operation. Write operations may need additional time as time that could have been used to actually write data to the CAM sub-arrays is now used to provide margin to ensure that correct data is written.

It would therefore be desirable to provide a way to time the write enable signal relative to data signals that may require less guardband than conventional approaches.

SUMMARY OF THE INVENTION

According to disclosed embodiments, a content addressable memory (CAM) may include data signals connected to multiple CAM core circuits and a write control signal that is routed along side the data signals. CAM core circuits may include write circuits that transfers data on data signals lines to CAM cells. Write circuits may be enabled in response to a write control signal.

According to one aspect of the embodiments, a write control signal line may be routed to be at least as long as the longest of the data signal lines.

According to another aspect of the embodiments, a write control signal may be surrounded by signals of the opposite polarity.

According to another aspect of the embodiments, the data signals may include both true and complement signals. There may be more than 100 pairs of true and complement data signals.

According to another aspect of the embodiments, true and complement data signals may be used to indicate at least three different functions; a write "1", a write "0", and a mask operation.

According to another aspect of the embodiments, repeater circuits may be used to regenerate data signals and write control signals.

According to another aspect of the embodiments, a clocked register circuit and a delay circuit may be used to generate a write control signal.

BRIEF DESCRIPTION OF THE DRAWINGS

FIGS. 2B–2C are more detailed block diagrams showing portions of a second embodiment.

FIG. 3A is a truth table showing one example of write operation according to one embodiment.

DETAILED DESCRIPTION OF THE EMBODIMENTS

Figure 1:
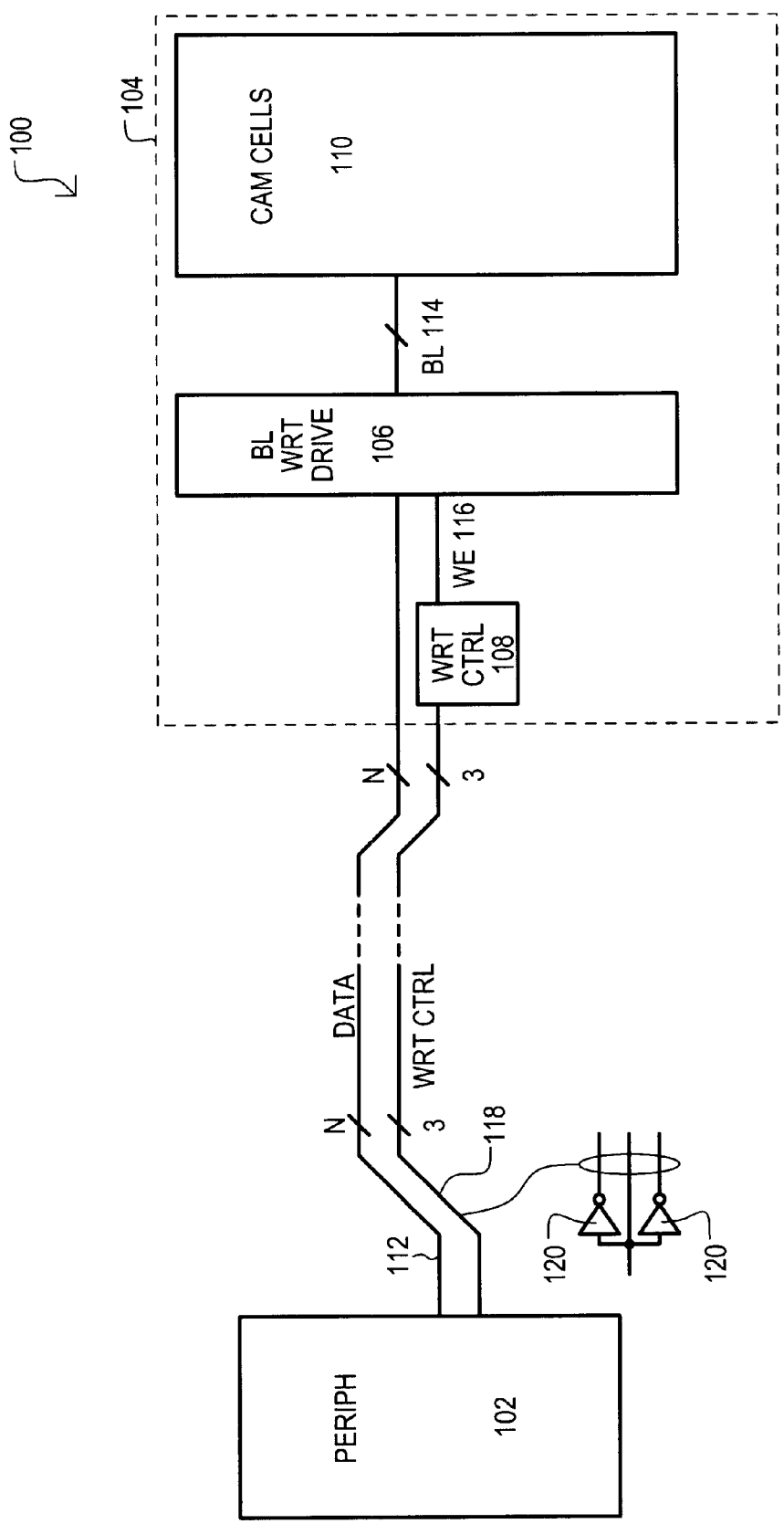
FIG. 1 is a block diagram of a first embodiment.

Various embodiments will now be described in conjunction with a number of diagrams. The embodiments set forth a content addressable memory (CAM) having write circuits that may provide improved write performance over conventional approaches. Referring to FIG. 1, a write portion of a CAM according to a first embodiment is set forth in a block diagram and designated by the general reference character 100.

A first embodiment 100 may include periphery circuits 102 that generate signals that can be connected to one or more CAM core circuits 104. Such signals may be susceptible to capacitive coupling and/or other delay effects. In one particular case, signals from periphery circuits 102 may travel relatively large distances over a semiconductor device with respect to other signals on the same device.

As shown in FIG. 1, a CAM core circuit 104 may include bitline write driver circuits 106, a write control circuit 108, and memory cells. In this case, memory cells include CAM cells 110. Bitline write driver circuits 106 can write data into the CAM cells 110. In one particular arrangement, bit line write driver circuits may receive data on data signal lines 112 and output such data to bitlines 114. Bit lines 114 mat be connected to CAM cells 110.

Writing of data onto bitlines 114 may be controlled by a write enable signal 116. A write enable signal 116 can be generated by a write control circuit 108 in response to write control signals on write control signal lines 118. In one approach, write control signal lines 118 may route along side data signal lines 112 over the distance between the periphery circuits 102 and CAM core circuits 104. Such a routing is represented by various changes in direction of signal lines in FIG. 1. Of course, routing of data signal lines 112 and write control signals 118 may take any of a number of forms depending upon a particular device.

As discussed above, the speed of signals in a device, such as data signals 112 and/or write control signals 118, may be affected by various factors, including signal routing and capacitive coupling. Thus, one or more data signals 112 may be delayed with respect to write control signals 118. To help ensure that proper data is reliably written to the CAM cells 110, it is desirable for data on data signals 112 to arrive at bitline write driver circuits 106 prior to a write enable signal 116 being activated. To ensure high performance, however, it is desirable to minimize any excess delay between the time that data on data signal lines 112 is valid and the time that a write enable signal 116 is activated. It is therefore desirable for a timing of a write control signal 118 to match, as closely as possible, a slowest of the data signals 112.

In a preferred embodiment, write control signals 118 may have a routing that is as long as the longest of data signals 112. In this way, a routing delay due to parasitic resistance and capacitance of write control signals 118 can closely match that of the longest of the data signals 112.

In addition or alternatively, write control signals 118 may be generated and situated to introduce a worst-case capacitive coupling delay as well. This can further help ensure that the timing of write control signals 118 can match, as closely as possible, the timing of a slowest of data signal 112. In one particular arrangement, write control signals 118 may include a write control signal routed adjacent to one or more signals that is its complement. More particularly, a write control signal may be surrounded on both sides by its complement. Such complement signals may be generated by inverter devices 120, as but one example. The coupling of complementary signals on adjacent lines to a write control signal 118 may therefore be representative of a worst case coupling that can occur for any particular one of the data signals 112.

Thus, a first embodiment 100 can include a write control signal 118 that is timed to match a slowest data signal 112. In this way, data may be more reliably written into CAM cells 110, while achieving higher performance than other conventional approaches.

Figure 2A:
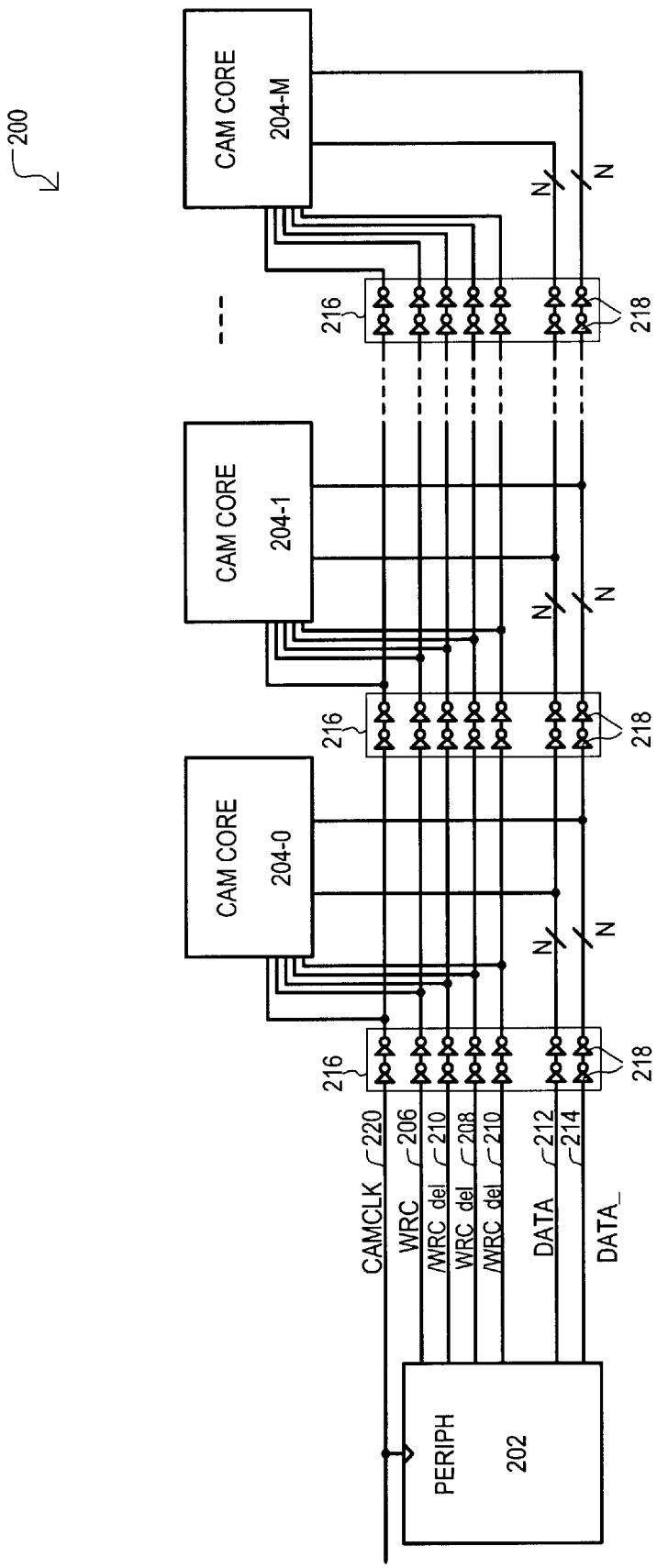
FIG. 2A is a block diagram of a second embodiment.

Referring now to FIG. 2A, a second embodiment is set forth in a block schematic diagram and is designated by the general reference character 200. A second embodiment 200 is shown to include periphery circuits 202 that can generate signals routed to multiple CAM core circuits (or "sub-arrays") 204-0–204-M (where "M" indicates the number of separate CAM sub-arrays).

Outputs of periphery circuits 202 may include a various control signals. In one embodiment, such control signals may include a first write control signal (WRC) 206, a second write controls signal (WRC_del) 208, and two complementary write control signals (/WRC_del) 210. In the second embodiment described, complementary write control signals (/WRC_del) 210 can be the complement of second write control signal (WRC_del) 208. Further, complementary write control signals (/WRC_del) 210 can have the physical placement shown in FIG. 2A, of running on both sides of second write control signal (WRC_del) 208.

Outputs of periphery circuits 202 may also include a number of data signals DATA 212 and DATA_ 214. In the particular example of FIG. 2A, DATA 212 and DATA_ 214 may both include N data signals. Data signals (DATA and DATA_) may be routed to all, or selected of CAM core circuits (204-0 to 204-M). Accordingly, it is noted that while the CAM described in FIG. 2A shows data signals connected to each CAM sub-array, any number of other combinations may be possible. As but one example, half of the data signals (DATA and DATA_) may be connected to each alternating array.

It is additionally noted that data signals (DATA or DATA_) may have particular routing arrangements to address adverse effects of capacitive coupling. More particularly, data signals groups may include one line for a data value (a true value), and an accompanying line for its complement. Such true/complement lines may be routed next to one another. This may reduce skew effects arising from capacitive coupling. In one very particular example, DATA_ signals may be the complements of DATA signals. Further, each DATA signal may be laid out adjacent to its corresponding complement DATA_ signal.

As will be described at a later point herein, a "complementary" data line does not necessarily always carry a value that is complementary to a corresponding data line. In particular, a data line/complementary data line pair may be driven to the same value for specialized CAM operations. Such an operation will be described in more detail below.

As shown in FIG. 2A, a second embodiment 200 may also include repeater circuits 216. Repeater circuits may regenerate signals routed from periphery circuits 202 to CAM core circuits (204-0 to 204-M). A repeater circuit 216 may include two inverter devices 218 connected together in series, as but one example. Repeater circuits may allow higher signal quality to be maintained when signals are routed over a large distance.

It is, noted that while repeater circuits 216 are shown in FIG. 2A that regenerate signals for each CAM array (204-0 to 204-M), other configurations are also possible. As but one example, repeater circuits 216 may be configured to regenerate signals for alternating arrays. In such an arrangement, half of the signals can be regenerated at each array. In this way, a higher signal quality may be maintained while using less layout area for repeater circuit 218 devices.

A second embodiment 200 may also include a clock signal, CAMCLK 220 that may be used to control operation of periphery circuits 202 and/or CAM core circuits (204-0 to 204-M).

Referring now to FIG. 2B, a detailed diagram of one example of periphery circuits 202 is shown. Periphery circuits 202 may receive as inputs, a clock signal CAMCLK 220, data values DATA'234 and DATA_'235, and a write control signal WRC 206. In response to such inputs, periphery circuits 202 may provide as outputs, data signals DATA and DATA_ (212 and 214), a write control signal WRC_del 208, and two complements of such a write control signal /WRC_del 210. A periphery circuit 202 of FIG. 2B can also provide a write control signal WRC 206 as an output.

Periphery circuits 202 may include register circuits 222a–c. In the particular example shown in FIG. 2B, register circuits 222a–c may be "negative" clocked register circuits. It is generally known that such register circuits may transfer the logic state at an input of the register to an output of the register on a falling edge of a controlling clock signal. In the case of FIG. 2B, a controlling clock signal may be clock signal CAMCLK 220.

In one portion of periphery circuits 202, a write control signal WRC 206 may essentially "pass" through as an output signal. It is understood that while such a passing through may include routing the signal without any intermediate circuit, or alternatively, passing such a signal through one or more logic circuits.

A write control signal WRC 206 may also be used to generate another write control signal. In the particular case of FIG. 2B, a first write control signal WRC 206 may be used to generate a second write control signal WRC_del 208, that is delayed with respect to a first write control signal WRC 206. In one particular approach, a first write control signal WRC 206 may be connected to an input of clocked register circuit 222a, which may output a clocked write control signal. Such a clocked write control signal can be provided as an input to a delay circuit 226. A delay circuit 226 may introduce a delay δ. An output of a delay circuit 226 can be a second write control signal WRC_del 208. In this way, if a first write control signal WRC 206 is high, a falling edge of a clock signal CAMCLK 220 may generate a second write control signal WRC_del 208 after a delay δ.

A WRC signal 206 may enable a write operation to CAM core circuits. A WRC_del signal 208 can be used to control the timing of such write operation to the CAM sub-arrays. By adjusting a delay δ of delay circuit 226, the start of a write operation may be adjusted, depending on various circuit design parameters. This may further help to ensure that valid data is written to CAM sub-arrays.

It is additionally noted that in one embodiment, a clocked register 222a may have a particular physical placement with respect to other clocked registers (222b and 222c) and a clock signal CAMCLK 220. In particular, a clocked register 222a may be situated further from a clock signal CAMCLK 220 than clocked register circuits (222b and 222c). This may help to ensure that a first write control signal WRC 206 is clocked out of clocked register 222a after data values 234 and 235 are clocked out of clocked registers 222b and 222c.

Referring once again to FIG. 2B, a second write control signal WRC_del 208 may further be connected to two inverter circuits 232a and 232b. Inverter circuits (232a and 232b) can generate complementary /WRC_del signals 210. As noted previously, such signals may be routed on either side of a WRC_del signal 208. By routing complementary signals /WRC_del 210 on either side of a second write command signal WRC_del 208, the timing of a second write control signal WRC_del 208 may be made to more closely match that of a slowest write data value, by introducing an essentially worst case capacitive coupling delay.

In another portion of periphery circuits 202, data values DATA'234 and DATA_'235 may be connected to inputs of clocked register circuits 222b and 222c, respectively. In one particular arrangement, the number of signals in a group DATA'234 may be the same as that of signals DATA 212. Similarly, the number of signals in a group DATA_'235 may be the same as that of signals DATA_214. Accordingly, clocked register circuit 222b may receive signals DATA'234 and output such signals as signals DATA 212, according to clock signal CAMCLK 220. At the same time, clocked register circuit 222c may receive signals DATA_'235 and output such signals as signals DATA_212, according to clock signal CAMCLK 220.

In this way, on an edge of a clock signal CAMCLK 220 (e.g., a falling edge), data values (DATA 212 and DATA_ 214) may be provided as write data to one or more CAM core circuits.

Referring now to FIG. 2C, a detailed diagram of one example of CAM core circuits 204 is shown. CAM core circuits 204 may include a write control circuit 234, bitline write driver circuits 236, and CAM cells 238.

A write control circuit 234 may receive first write command signal WRC 206 and a second write command signal WRC_del 208. Within a write control circuit 234, first and second write command signals (206 and 208) can be logically combined along with the complement of CAMCLK 220. In the particular example of FIG. 2B, such a logical combination can include a NAND circuit 240. Note that a NAND circuit 240 can be but a simple description or representation of a possible logic function of a write control circuit 234. Of course, such a circuit may contain other logic and/or driver devices and/or timing control. As but one example, the operation of a NAND circuit 240 may be controlled by the CAMCLK signal 220.

A write control circuit 234 may provide a write enable signal /WE 242 as an output. In the example of FIG. 2B, a write enable signal /WE may be generated from by a NAND circuit 240. In this way, if a first write command signal WRC 206 and a second write command signal WRC_del signal 208 are both high, and a CAMCLK signal 220 is low, a write enable /WE signal 242 can be enabled (in this example, low). Otherwise, a write enable signal /WE 242 can be high.

Each CAM core circuit 204 may include bitline write driver circuits 236. In one approach, there may be one bit line write driver circuit for each bit of data that can be written into a CAM core circuit 204. Thus, if a CAM core circuit 204 provides N bits of data, there may be N bit line write driver circuits 236. Bitline write driver circuits 236 may receive data signals DATA 212 and DATA_ 214. Bitline write driver circuits 236 may drive data values on bit lines BIT 244 and inverse bit lines /BIT 246. Bit lines BIT 244 and /BIT 246 may be connected to CAM cells 238. Bitline write driver circuit 236 may also receive an input write enable signal /WE 242, which can enable write driver circuit 236.

As in the case of data values DATA and DATA_ (212 and 214), bitlines BIT and /BIT may include one line for a data value (true), and an accompanying line for its complement. Each true bit line may be adjacent to its corresponding complement.

In a preferred embodiment, a bitline write driver circuit 236 may drive bit lines BIT and /BIT (244 and 246) in a fashion that can differ from conventional approaches. In particular, in response to a complementary data value pair, a bit line pair may be driven to corresponding complementary values. However, in response to a data value pair of the same value, a bitline write driver circuit 236 of an embodiment may inhibit write operations to bit line pairs. This can enable particular operations, such as a data mask operation, to be performed on CAM cells 238.

In a data mask operation, a particular bit out of many bits, may be masked from a write operation. That is, a write operation will not necessarily affect the data value stored.

One example of a bitline write driver circuit 236 operation is illustrated by the truth table shown in FIG. 3A. If a DATA input 212 is "0" (logic low) and a DATA_input 214 is "1" (logic one) then a "0" can be written to outputs (e.g., to a bit line pair). If a DATA input 212 is "1" and a DATA_input 214 is "0" then a "1" can be written to outputs. However, unlike many conventional approaches, if a DATA input 212 and a DATA_input 214 are both "0", a mask operation may be performed. In the example of FIG. 3A, the case where a DATA input 212 and a DATA_input 214 are both "1" can be prevented from occurring, and so may be considered an "illegal" operation for the purposes of this description.

Figure 3B:
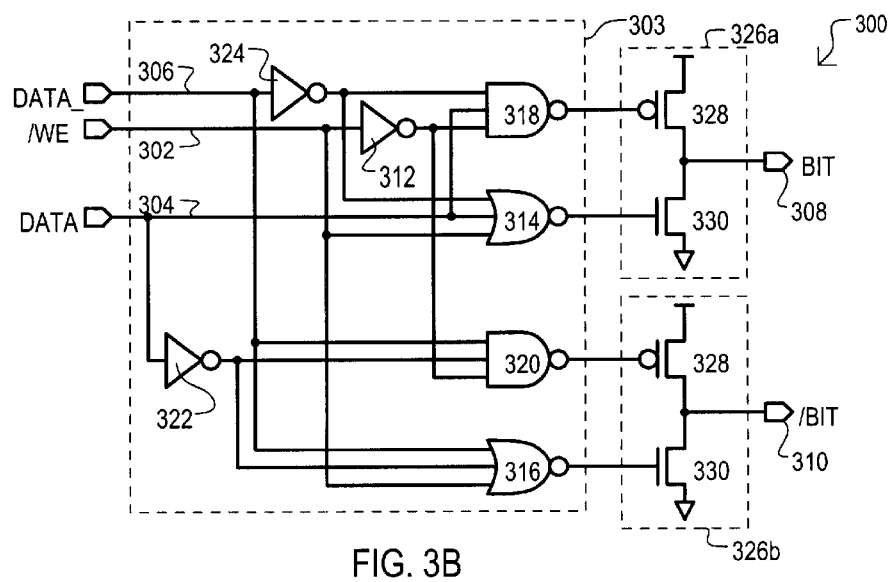
FIG. 3B is a schematic diagram of one example of a data write circuit.

One example of a bitline write driver circuit 236 that can have the functionality described in FIG. 3A is shown in FIG. 3B in a detailed schematic diagram. A bitline write driver circuit is referred to by the general reference character 300. A bitline write driver circuit 300 may include a /WE input 302, a DATA input 304, a DATA_input 306. In response to such inputs, a bitline write driver circuit 300 may provide a bitline output BIT 308, and a /bitline output /BIT 310.

A bitline write driver circuit 300 may include control logic 303, a first driver 326a and a second driver 326b. Control logic 303 may receive data values DATA and DATA_ (304 and 306) and write enable signal /WE 302, and provide output values to first and second drivers (326a and 326b). Such output value can result in a response such as that shown in FIG. 3A.

In the example of FIG. 3B, control logic 303 may include various inverter gates 312, 322 and 324 for generating complements of signals /WE 302, DATA 304 and DATA_ 306. In addition, logic gates 314, 316, 318 and 320 may receive various combinations of signals and/or their complements, and thereby control drivers (326a and 326b). In the particular example of a FIG. 3B, first driver 326a may be controlled by a NOR gate 314 and a NAND gate 318, while second driver 326b may be controlled by a NOR gate 316 and a NAND gate 320.

As shown in FIG. 3B, a /WE input 302 may be connected to an input of an inverter gate 312, an input of a NOR gate 314, and an input of a NOR gate 316. The output of an inverter gate 312 may be connected to an input of a NAND gate 318 and an input of a NAND gate 320.

A DATA input 304 may be connected to an input of a NOR gate 314, an input of a NAND gate 318, and to an input of an inverter gate 322. The output of an inverter gate 322 may be connected to an input of a NAND gate 320 and to an input of a NOR gate 316.

A DATA_input 306 may be connected to an input of a NOR gate 316, an input of a NAND gate 320, and to an input of an inverter gate 324. The output of an inverter gate 324 may be connected to an input of a NOR gate 314 and to an input of a NAND gate 318.

A first driver circuit 326a may receive an output of a NAND gate 318 and an output of a NOR gate 314, and have an output coupled to a bitline 308. Second driver circuit 326b may receive an output of a NAND gate 320 and an output of a NOR gate 316, and have an output coupled to a /bitline 310.

While driver circuits (326a and 326b) may take various forms, in the example of FIG. 3B, first and second driver circuits (326a and 326b) may include a P-channel MOS (PMOS) device 328 and an N-channel MOS (NMOS) device 330. A PMOS device 328 may have a source electrode connected to a power supply, a drain electrode connected to an output (bitline 308 or /bitline 310), and a gate electrode connected to an output from control logic 303 (an output of either a NAND gate 318 or a NAND gate 320). An NMOS device 330 may have a drain electrode connected to an output (bitline 308 or /bitline 310), a source electrode connected to a power supply (e.g., ground), and a gate electrode connected to an output from control logic 303 (an output of either a NOR gate 314 or a NOR gate 316).

The operation of a bitline write driver circuit 300 will now be described. If a write enable signal /WE 302 is inactive (high in this case), a low input can be provided to NAND gates 318 and 320 via inverter 312, and the outputs of NAND gates (318 and 320) can be forced high. Similarly, a high input can be provided to NOR gates 314 and 316, and the outputs of NOR gates (314 and 316) can be forced low. Consequently, PMOS devices 328 and NMOS devices 330 can be turned off. As a result, driver outputs (e.g., bitline 308 and /bitline 310) can be placed in a high impedance (non-driven) state.

In this way, a bitline write driver circuit 300 may be disabled according to a write enable signal /WE 302.

If a write enable signal /WE 302 is active (low in this case), a bitline write driver circuit 300 may operate in accordance with the truth table shown in FIG. 3A. With a write enable signal /WE 302 low, inverter 312 can provide a high input to NAND gates 318 and 320, resulting in the outputs of such NAND gates (318 and 320) being dependent upon their other inputs. Similarly, a low write enable signal /WE 302 can be provided to NOR gates 314 and 316, resulting in the outputs of such NOR gates (314 and 316) being dependent upon their other inputs.

If a DATA input 304 and a DATA_ input 306 are both "0", DATA input 304 can provide a low input to NAND gate 318 and DATA_ input 306 can provide a low input to NAND gate 320. Similarly, inverter 324 can provide a high input to NOR gate 314 while inverter 322 can provide a high input to NOR gate 316. Thus, as in the case where a write enable signal /WE is inactive, driver outputs (e.g., bitline 308 and /bitline 310) can both be in a high impedance state.

In this way, when a DATA input 304 and DATA_ input 306 are both "0" data may be prevented from being written onto the bitlines, which can effectively "mask" a write operation, even though a bit line write driver circuit 300 may be enabled.

If a DATA input 304 is "0" and a DATA_ input 306 is "1", NAND gate 318 and NOR gate 314 may both provide high outputs. Thus, an output of first driver circuit 326a (bitline 308) can be "0". At the same time, NAND gate 320 and NOR gate 316 may both provide low outputs. Thus, an output of second driver circuit 326b (/bitline 310) can be "1." This may be considered a write "0" operation.

If a DATA input 304 is "1" and a DATA_ input 306 is "0", NAND gate 318 and NOR gate 314 may both provide low outputs. Thus, an output of first driver circuit 326a (bitline 308) can be "1". At the same time, NAND gate 320 and NOR gate 316 may both provide high outputs. Thus, an output of second driver circuit 326b (/bitline 310) can be "0." This may be considered a write "1" operation.

If both a DATA input 304 and a DATA_ input 306 are "1", then outputs of first and second driver circuits 326a and 326b (bitline 308 and /bitline 310) can both be in a high impedance state. This state might not be used, however, and may therefore be considered an illegal operation.

In this way, a bitline write driver circuit 300 may be enabled according to a write enable signal /WE 302. Further, when enabled, a bitline write driver circuit 300 may be capable of providing a write 0, write 1 or "mask" write function according to received data inputs.

Figure 4:
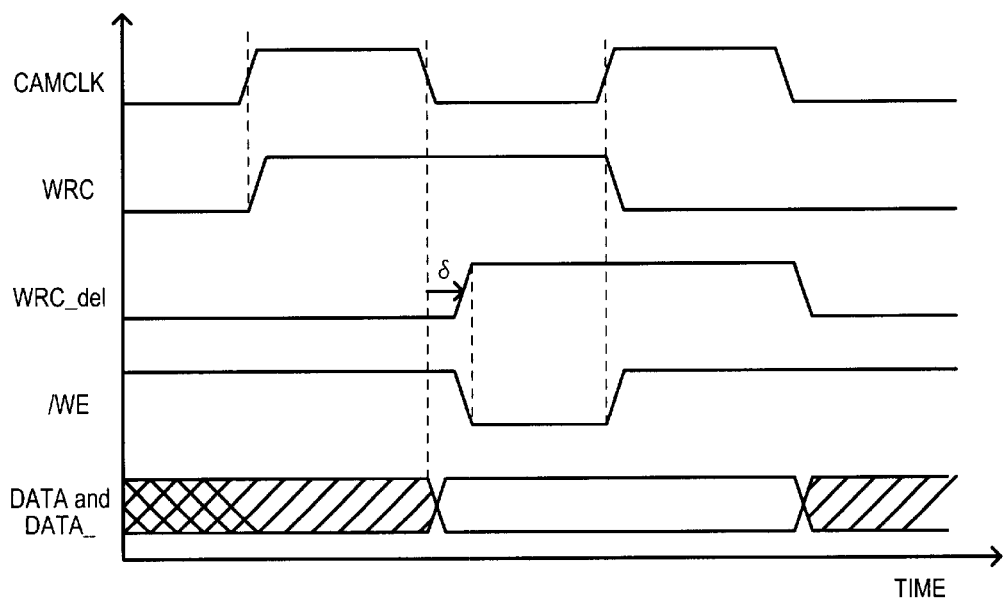
FIG. 4 is a timing diagram illustrating a write operation according to a second embodiment.
Figure 5:
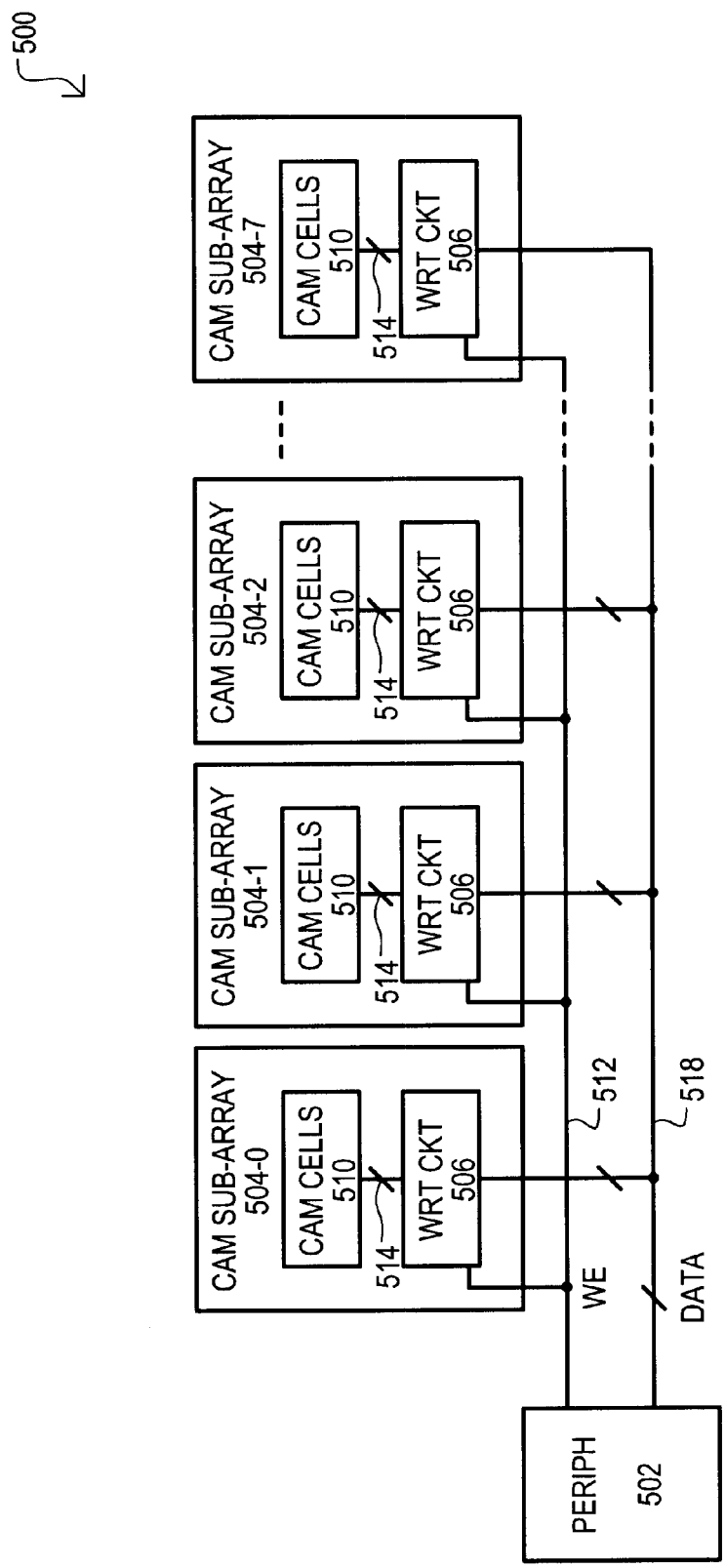
FIG. 5 is a block diagram of write portions in a conventional CAM.

Referring now to FIG. 4, a timing diagram of a CAM write operation according to one embodiment will now be described in more detail. FIG. 4 shows the behavior of a number of signals, all defined previously, and possible interactions between such signals. The signals shown include clock signal CAMCLK 220, first write control signal WRC 206, second write control signal WRC_del 208, write enable signal /WE 242, data value DATA 212, and "complementary" data value DATA_214.

In one arrangement, a clock signal CAMCLK 220 may be a master clock that can control a timing of various CAM operations. During a write operation, a rising edge of clock signal CAMCLK 220 may activate a first write control signal WRC. On the subsequent falling edge of CAMCLK 220 write data (DATA 212 and DATA_214) may be released to propagate across a device (e.g., toward CAM core circuits such as 204-0 to 204-M). In addition, after a delay δ following a falling edge of a clock signal CAMCLK 220, a second write control signal WRC_del 208 can be activated.

When both a first write control signal WRC 206 and second write control signal WRC_del 208 are active, a write enable signal /WE 242 can be activated. With a write enable signal /WE 242 active, data may be driven or masked on bit lines according to data values DATA and DATA_. More particularly, a write 0, write 1 or mask operation may be undertaken for each bit.

In the particular example of FIG. 4, on a subsequent rising edge of CAMCLK 220 (in this case, the next rising edge), a first write control signal WRC 206 may be deactivated (brought low). Similarly, and on a subsequent falling edge of CAMCLK 220 (in this case the next falling edge), a second write control signal WRC_del 208 may be deactivated (brought low).

As previously discussed, it can be desirable to ensure that a write enable signal /WE 242 is enabled later than a slowest of data signals DATA 212 and DATA_214. Such a timing arrangement can enable more reliable writing of data and other operations. It is noted that such a timing may be of importance if write data is to be masked, since false data may otherwise be written into the CAM cells.

Since the activation of a second write control signal WRC_del 208 may determine when a write enable /WE signal 242 is activated, it can be desirable to try to ensure that a second write control signal WRC_del 208 rises later than a slowest of data signals DATA 212 and DATA_214.

Since, in a second embodiment 200, a timing of second write control signal WRC_del 208 can closely matches that of a slowest of data signals DATA 212 and DATA_214, a delay, δ, may be made smaller than would otherwise be implemented in conventional approaches that could include additional guardband. In this way, a CAM write operation may be implemented that may be reliable, as well as faster than that which would be possible using conventional techniques.

It is noted that while the embodiments presented have described various circuits, signals, and methods in relation to CAM write operations, it may be possible that such circuits, signals, and methods may interact with, or otherwise be part of other operations of a CAM as well, such as read operations or test mode operations as but two examples.

It is further noted that a CAM as described may be either a separate circuit or a sub-component of a larger more complex device such as a network processor, as but one example.

Thus, while the preferred embodiments set forth herein have been described in detail, it should be understood that the present invention could be subject to various changes, substitutions, and alterations without departing from the spirit and scope of the invention. Accordingly, the present invention is intended to be limited only as defined by the appended claims.

What is claimed is:

1. A circuit, comprising:

a plurality of data signal lines coupled to a plurality of memory cells;

a write control signal line that carries a write control signal that is routed essentially along side the data signal lines; and a write circuit that transfers data on the data signals lines into the memory cells that is enabled in response to the write control signal.

2. The circuit of claim 1, wherein:

the write control signal line has a first routing path that is at least as long as a longest routing path of the data signal lines.

3. The circuit of claim 1, wherein:

the write control signal line is surrounded on at least two sides by a signal of the opposite polarity.

4. The circuit of claim 1, wherein:

the data signal lines include signal line pairs that each carry a true and a complement signal in a write operation.

5. The circuit of claim 4, wherein:

the write circuit writes a first value into at least one CAM cell when the true and complement signals have a first combination of values, writes a second value into the at least one CAM cell when the true and complement values have a second combination of values, and does not write data into the at least one CAM cell when the true and complement values have a third combination of values.

6. The circuit of claim 4, wherein:

the number of true signals is greater than 100 and the number of complement data signals is greater than 100.

7. The circuit of claim 1, further including:

at least one repeater circuit that regenerates data signals on the data signal lines and regenerates the write control signal.

8. The circuit of claim 1, further including:

a write command signal; and a write control circuit that combines the write command signal and the write control signal to generate a local write enable signal that enables the write circuit.

9. The circuit of claim 8, further including:

a first clocked register circuit that receives the write command signal and provides a clocked write command signal as an output in response to a clock signal; and a delay circuit that delays the clocked write command signal to generate the write control signal.

10. The write circuitry of claim 1, further including:

a plurality of data clocked register circuits that input data signals and provides the data signals on the data signal lines in response to a clock signal; and a write control clocked register circuit that inputs an initial write control signal and provides the write control signal on the write control signal line in response to the clock signal, the write control clocked register circuit being further from a clock signal origin than the plurality of data clocked register circuits.

11. A circuit, comprising:

a delayed write command signal line that transmits a delayed write command signal for controlling the writing of data to a plurality of memory cells; and at least one complementary delayed write command signal line adjacent to the delayed write command signal line that transmits a complement of the delayed write command signal.

12. The circuit of claim 11, wherein:

the plurality of memory cells include content addressable memory (CAM) cells; and the at least one complementary delayed write command signal line includes two complementary delayed write command signal line on opposite sides of the delayed write command signal lines, each complementary delayed write command signal line transmitting the complement of the delayed write command signal.

13. The circuit of claim 11, further including:

a first clocked circuit that receives an initial write command signal as an input, and outputs the delayed write command signal as an output in response to a predetermined transition in a clock signal; and at least one second clocked circuit that receives initial data values as inputs, and outputs data values in response to the predetermined transition in the clock signal.

14. The circuit of claim 11, further including:

a plurality of data lines arranged into a first portion and a second portion that carry write data in a write operation; and a plurality of first repeater circuits for regenerating write data values for the first portion of data lines and a plurality of second repeater circuits for regenerating write data values for the second portion of data lines, the first repeater circuits alternating with the second repeater circuits in the direction of the data lines.

15. The circuit of claim 11, further including:

write driver circuits that write data into the plurality memory cells in response to a write enable signal;

a logic circuit that activates the write enable signal when the delayed write command signal and a non-delayed write command signal are both active, the non-delayed write command signal being activated before the delayed write command signal in a write operation.

16. A method, comprising the steps of:

delaying a clocked write control signal with respect to clocked data signals with at least capacitive coupling by activating a complementary clocked write control signal on at least one signal line adjacent to the clocked write control signal; and writing predetermined data values into memory cells based on the clocked data signals in response to the delayed clocked write control signal.

17. The method of claim 16, further including:

commonly outputting the clocked write control signal and data values in response to the same clock signal.

18. The method of claim 17, further including:

delaying the clocked write control signal includes activating a complementary clocked write control signal on signal lines adjacent to, and on opposite sides of a signal line carrying the clocked write control signal.

19. The method of claim 16, further including:

delaying the clocked write control signal with a delay circuit.

20. The method of claim 16, further including:

writing predetermined data values includes writing a first data value to at least one content addressable memory (CAM) cell when complementary data lines have a first combination of values, writing a second data value to the at least one CAM cell when the complementary data lines have second combination of values, and inhibiting the writing of data to the at least one CAM cell when the complementary data lines have at least a third combination of values.

* * * * *